United States Patent
Eun et al.

(10) Patent No.: US 8,481,390 B2
(45) Date of Patent: Jul. 9, 2013

(54) METHOD FOR FORMING IMPURITY REGION OF VERTICAL TRANSISTOR AND METHOD FOR FABRICATING VERTICAL TRANSISTOR USING THE SAME

(75) Inventors: Yong Seok Eun, Seongnam-si (KR); Tae Kyun Kim, Seongnam-si (KR); Kyong Bong Rouh, Icheon-si (KR); Eun Shil Park, Guri-si (KR)

(73) Assignee: SK Hynix Inc., Gyeonggi-do (KR)

( * ) Notice: Subject to any disclaimer, the term of this patent is extended or adjusted under 35 U.S.C. 154(b) by 108 days.

(21) Appl. No.: 13/084,220

(22) Filed: Apr. 11, 2011

(65) Prior Publication Data
US 2011/0306192 A1 Dec. 15, 2011

(30) Foreign Application Priority Data

Jun. 11, 2010 (KR) .................. 10-2010-0055296

(51) Int. Cl.
*H01L 21/336* (2006.01)
(52) U.S. Cl.
USPC .......................... 438/272; 438/270; 257/330
(58) Field of Classification Search
USPC ........... 438/262, 268, 270, 272; 257/328–334
See application file for complete search history.

(56) References Cited

U.S. PATENT DOCUMENTS

| 6,040,210 | A  | * | 3/2000 | Burns et al. ............... 438/270 |
| 7,141,845 | B2 | * | 11/2006 | Manger et al. ............ 257/301 |
| 7,951,667 | B2 | * | 5/2011 | Kim .............................. 438/268 |
| 2007/0190766 | A1 | * | 8/2007 | Seo et al. .................... 438/585 |
| 2009/0148991 | A1 | * | 6/2009 | Chung et al. ................ 438/268 |
| 2010/0216289 | A1 | * | 8/2010 | Park et al. ................... 438/268 |
| 2010/0283094 | A1 |   | 11/2010 | Kim et al. |
| 2010/0283102 | A1 |   | 11/2010 | Cho |
| 2011/0003447 | A1 |   | 1/2011 | Kim et al. |
| 2011/0006360 | A1 |   | 1/2011 | Ikebuchi |
| 2011/0012192 | A1 |   | 1/2011 | Hsu et al. |
| 2011/0012193 | A1 |   | 1/2011 | Nojima |

FOREIGN PATENT DOCUMENTS

| KR | 100908819 B1 | 7/2009 |
| KR | 100955175 B1 | 4/2010 |
| KR | 1020100055066 A | 6/2010 |

* cited by examiner

*Primary Examiner* — Hung Vu
*Assistant Examiner* — Bryan Junge
(74) *Attorney, Agent, or Firm* — William Park & Associates Patent Ltd.

(57) ABSTRACT

A method for forming an impurity region of a vertical transistor includes forming an impurity ion junction region within a semiconductor substrate, and forming a trench by etching the semiconductor substrate in which the impurity ion junction region is formed. The etching process is performed to remove a portion of the impurity ion junction region, so that a remaining portion of the impurity ion junction region is exposed to a lower side wall of the trench to serve as a buried bit line junction region.

8 Claims, 12 Drawing Sheets

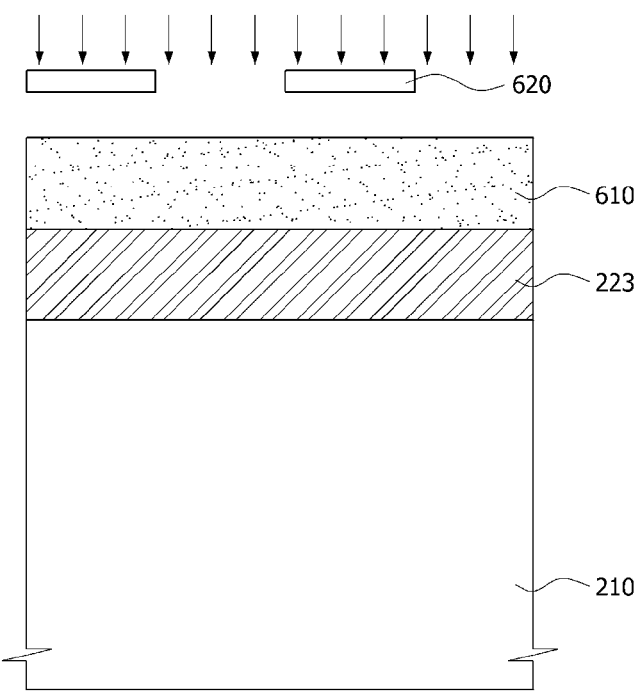
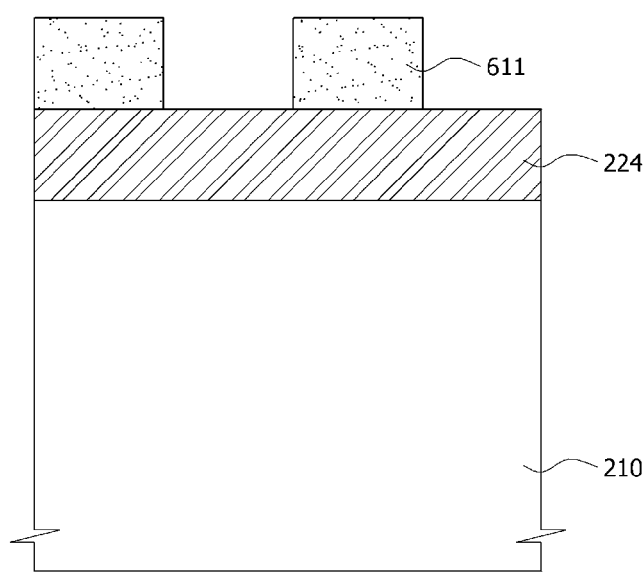

METHOD FOR FORMING IMPURITY REGION OF VERTICAL TRANSISTOR AND METHOD FOR FABRICATING VERTICAL TRANSISTOR USING THE SAME

CROSS-REFERENCES TO RELATED APPLICATIONS

The present application claims priority under 35 U.S.C 119(a) to Korean Application No. 10-2010-0055296, filed on Jun. 11, 2010, in the Korean intellectual property Office, which is incorporated herein by reference in its entirety set forth in full.

BACKGROUND

Exemplary embodiments of the present invention relate to a method for fabricating a semiconductor device, and more particularly, to a method for forming an impurity region of a vertical transistor and a method for fabricating a vertical transistor using the same.

As mobile devices are widely spread and digital home appliances become smaller in size, the degree of integration of semiconductor memory devices constituting the mobile devices or the digital home appliances is increasing. Particularly, in the case of a DRAM device or a flash memory device, various attempts have been made to store a great quantity of information in a limited space. In general, a DRAM device is configured with a transistor and a capacitor, and has a stack structure in which the transistor is formed on a silicon semiconductor substrate and the capacitor is formed on the transistor.

For electrical connection between the transistor and the capacitor, a storage node contact is formed between a source region of the transistor and a lower electrode of the capacitor. In addition, a drain region of the transistor is electrically coupled to a bit line through a bit line contact. In the structure in which the capacitor is formed on the planar type transistor, layers for signal transmission (for example, a word line and a bit line) are formed between the transistor and the capacitor. However, there is a limitation in increasing the capacity of the capacitor due to the space occupied by the layers for signal transmission. Moreover, if a gate width of the planar type transistor is less than 40 nm, a larger amount of power may be consumed, and an amount of a body current, which is a leakage current between the source region and the drain region of the transistor, may increase. In this regard, researches related to a vertical transistor are being actively conducted.

FIG. 1 is a diagram explaining the basic concept of a vertical transistor. Referring to FIG. 1, the vertical transistor 100 has a structure in which a drain region 112 is formed at a lower portion of a silicon semiconductor substrate 110, and a source region 114 is formed at an upper portion of the silicon semiconductor substrate 110. A channel region 116 is formed between the drain region 112 and the source region 114, and a gate dielectric layer 118 and a gate electrode 120 are sequentially formed on the lateral side of the silicon semiconductor substrate 110 over the channel region 116. If the vertical transistor 100 is applied to a DRAM device, a bit line is coupled to the drain region 112 and a storage node is coupled to the source region 114. Since the bit line is formed to be buried in the side of the lower portion of the silicon semiconductor substrate 110, the space in which the storage node is to be formed may not decrease. Thus, data storage capacity may be improved in spite of high degree of integration. In addition, as the bit line is formed in a buried shape, bit line parasitic capacitance may decrease, and thus the height of the storage node may decrease by about ½ to ⅓.

However, in order to form the vertical transistor as described above, the drain region 112 may be formed at the lower portion of the silicon semiconductor substrate 110, but this process may be difficult to perform. An example of the process of forming the drain region 112 will be described below. Before forming the drain region 112, a side of the lower portion of the silicon semiconductor substrate 110 at which the drain region 112 is to be formed is opened. A metal layer into which impurities are doped with high concentration is formed to be in contact with the opened region. Then, the drain region 112 is formed by diffusing the impurities doped within the metal layer toward the silicon semiconductor substrate 110.

In this case, however, if the position opened for the formation of the drain region 112 is not exact, a cell threshold voltage may greatly change. As an example, if the position opened for the formation of the drain region 112 is too low, the drain region 112 is too far away from the gate electrode 120, causing a cell threshold voltage to increase. In addition, if the position opened for the formation of the drain region 112 is too high, an overlapping region between the drain region 112 and the gate electrode 120 increases. Thus, the length of the channel region decrease and the cell threshold voltage decreases, and thus a floating body structure in which holes are accumulated may be formed.

Furthermore, since the drain region 112 is formed by diffusing the impurities doped within the metal layer toward the silicon semiconductor substrate 110, it is difficult to adjust the concentration of the drain region 112. If the concentration of the drain region 112 is too low, an ohmic contact may not be formed in the region which is in contact with the metal layer constituting the bit line. Thus, a contact resistance may increase. On the other hand, if the concentration of the drain region 112 is too high, the impurities ions may be additionally diffused by a subsequent thermal treatment. Consequently, a floating body structure may be formed. That is, holes accumulated in the deep drain region 112 may not flow out.

SUMMARY

An embodiment of the present invention relates to a method for forming an impurity region of a vertical transistor, which can precisely control a position and an impurity concentration thereof, and a method for fabricating a vertical transistor using the same.

According to an exemplary embodiment of the present invention, a method for forming an impurity region of a vertical transistor includes forming an impurity ion junction region within a semiconductor substrate, and forming a trench by etching the semiconductor substrate in which the impurity ion junction region is formed, wherein the etching process is performed to remove a portion of the impurity ion junction region, so that a remaining portion of the impurity ion junction region is exposed to a lower side wall of the trench to serve as a buried bit line junction region.

According to another exemplary embodiment of the present invention, a method for forming an impurity region of a vertical transistor includes preparing a semiconductor substrate having a first region where an active region is to be formed, and a second region where a trench is to be formed, forming an impurity ion junction region in the first region and the second region, and etching a portion of the semiconductor substrate including the second region to form a trench exposing a side of the first region and to form an active region which protrudes upwards having the first region at a lower portion of the active region, wherein the etching process is performed to remove the impurity ion junction region of the second region, so that the impurity ion junction region remaining in the first region serves as a buried bit line junction region exposed within the trench.

According to another exemplary embodiment of the present invention, a method for forming an impurity region of a vertical transistor includes preparing a semiconductor substrate having a first region and a second region, forming a first mask pattern on the semiconductor substrate, wherein the first mask pattern has an opening exposing a portion of the semiconductor substrate covering the first region and the second region, forming a first trench by performing an etching process using the first mask pattern as an etching mask, forming an impurity ion junction region in the semiconductor substrate under the bottom of the first trench by performing an ion implantation process using the first mask pattern as a mask for an ion implantation, filling the first trench with a material layer formed of a material which is substantially equal to a material of the semiconductor substrate, removing the first mask pattern, forming a second mask pattern having an opening exposing a portion of the semiconductor substrate covering the second region, and forming a second trench exposing a side of the first region by etching the portion of the semiconductor substrate covering the second region and the second region using the second mask pattern as an etching mask to form an active region which protrudes upwards and in which a buried bit line junction region is formed at a lower portion of the active region, wherein the etching process is performed to remove the impurity ion junction region of the second region, so that the impurity ion junction region remaining in the first region serves as a buried bit line junction region exposed within the second trench.

According to another exemplary embodiment of the present invention, a method for forming an impurity region of a vertical transistor includes preparing a semiconductor substrate having a first region and a second region, forming an impurity ion junction region in the semiconductor substrate by performing an ion implantation process on the semiconductor substrate, forming a material layer, which is equal to the semiconductor substrate, on the semiconductor substrate in which the impurity ion junction region, forming a trench exposing a side of the material layer of the first region by etching the material layer of the second region to form an active region which protrudes upwards and in which a buried bit line junction region is formed at a lower portion of the active region, wherein the etching process is performed to remove the impurity ion junction region of the second region, so that the impurity ion junction region remaining in the first region serves as a buried bit line junction region exposed within the trench.

According to another exemplary embodiment of the present invention, a method for fabricating a vertical transistor includes forming an impurity ion junction region at a lower portion of the semiconductor substrate by performing an ion implantation process on the semiconductor substrate, forming a trench by etching the semiconductor substrate, wherein the etching process is performed to remove a portion of the impurity ion junction region, so that a remaining portion of the impurity ion junction region is exposed at a lower portion of the trench and serves as a buried bit line junction region, and forming a buried bit line by forming an insulation layer at a lower portion of the trench so that the buried bit line is in contact with the buried bit line junction region.

BRIEF DESCRIPTION OF THE DRAWINGS

The above and other aspects, features and other advantages will be more clearly understood from the following detailed description taken in conjunction with the accompanying drawings, in which:

FIGS. 6 to 8 are cross-sectional views illustrating a process of forming a first mask pattern of FIG. 2 and a second mask pattern of FIG. 4;

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 2:
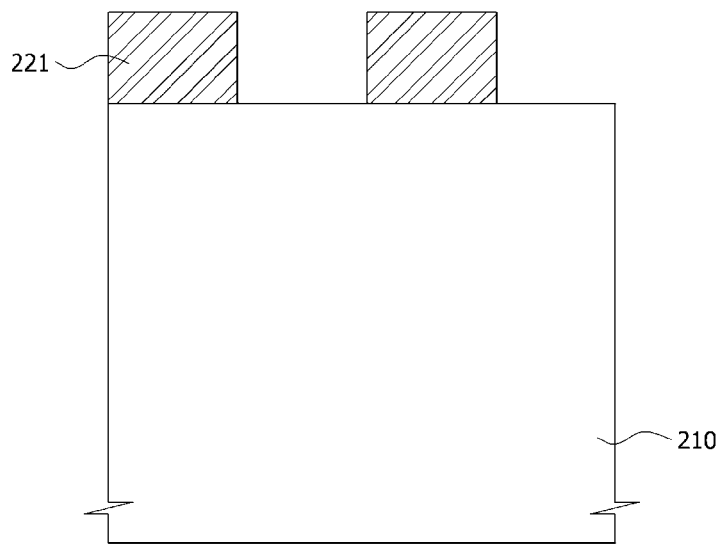
FIGS. 2 to 5 are cross-sectional views illustrating a method for forming an impurity region of a vertical transistor according to an exemplary embodiment of the present invention.

FIGS. 2 to 5 are cross-sectional views illustrating a method for forming an impurity region of a vertical transistor according to an exemplary embodiment of the present invention. Referring to FIG. 2, a first mask pattern 221 for ion implantation is formed on a semiconductor substrate 210 in which a vertical transistor is to be formed. The first mask pattern 221 includes a nitride layer. In some cases, the first mask pattern 221 may be formed in a structure in which an oxide layer and a nitride layer are stacked. In this case, the underlying oxide layer is formed for adhesion between the semiconductor substrate 210 and the nitride layer, and the oxide layer is formed to have a thickness corresponding to approximately 5-10% of the thickness of the nitride layer. The first mask pattern 221 should be thick enough to protect the semiconductor substrate 210 under the first mask pattern 221 from a subsequent ion implantation. As an example, the first mask pattern 221 is formed to have a thickness ranging from approximately 200 Å to approximately 800 Å.

Figure 3:
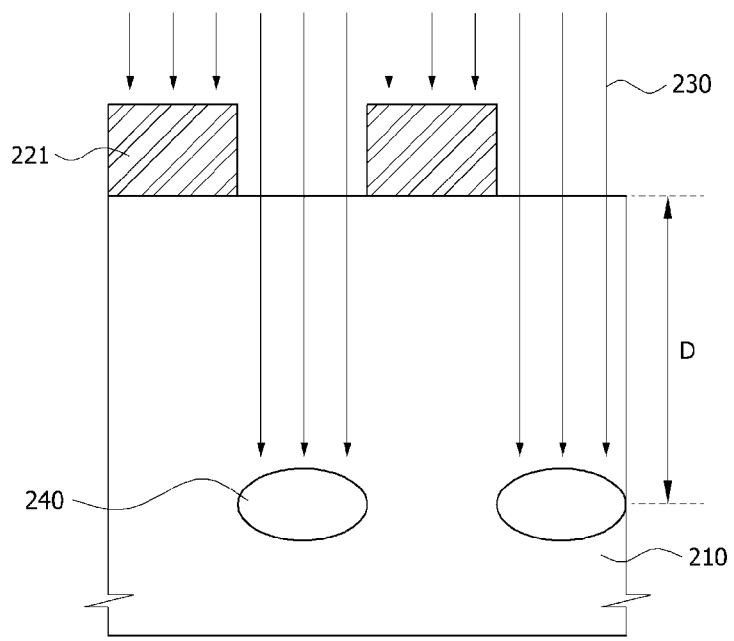

Referring to FIG. 3, impurity ions are implanted using the first mask pattern 200 as a mask for an ion implantation, as indicated by arrows 230. The impurity ions may be p-type impurity ions or n-type impurity ions. In this exemplary embodiment, a case of implanting n-type impurity ions will be taken as an example. Arsenide (As) may be used as the n-type impurity ions. An implantation energy may be set to a range from approximately 100 KeV to approximately 400 KeV, and a doping depth D may be set to a range from 500 Å to 2,000 Å. Through the ion implantation, an impurity ion junction region 240 is formed within the semiconductor substrate 210. In some cases, after the ion implantation, a diffusion process may be performed to diffuse the implanted impurity ions. For example, the diffusion process is performed through a thermal treatment. After the ion implantation, the first mask pattern 220 is removed.

Figure 4:
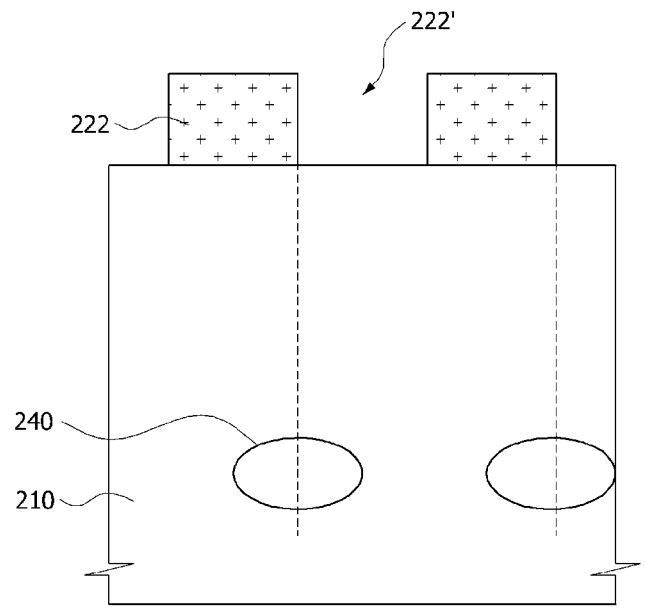

Referring to FIG. 4, a second mask pattern 222 is formed on the semiconductor substrate 210. The second mask pattern 222 is used as a hard mask layer during a subsequent etching process for forming a trench and may include a nitride layer. The semiconductor substrate 210 exposed by an opening 222' of the second mask pattern 222 is etched by a certain depth during a subsequent etching process, thereby forming a trench. Due to the trench, a portion of the impurity ion junction region 240, for example, approximately 50% of the impurity ion junction region 240 is removed, and the remaining portion of the impurity ion junction region 240 becomes a buried bit line junction region. According to an example, a side of the second mask pattern 222 is aligned with about the center of the impurity ion junction region 240, as indicated by dotted lines.

In this exemplary embodiment, in order for such an alignment, a photomask which has been used to form the first mask pattern 221 is used to form the second mask pattern 222. The process of forming the first mask pattern 221 and the second mask pattern 222 will be described below in more detail with reference to FIGS. 6 to 8. First, the process of forming the first mask pattern 221 will be described. As illustrated in FIG. 6, a first mask layer 223 and a first photoresist layer 610 are sequentially formed on a semiconductor substrate 210. An exposure process using a photomask 620 is performed to change a characteristic of a portion of the first photoresist layer 610, for example, a region onto which light is incident. As illustrated in FIG. 7, a development process is performed to selectively remove the portion of the first photoresist layer (610 in FIG. 6), a characteristic of which is changed. Through the development process, a first photoresist pattern 611 having an opening partially exposing the surface of the first mask layer 223 is formed. After forming the first photoresist pattern 611, the exposed region of the first mask layer 223 is removed using the first photoresist pattern 611 as an etching mask, thereby forming a first mask pattern 221 as illustrated in FIG. 2.

Figure 5:
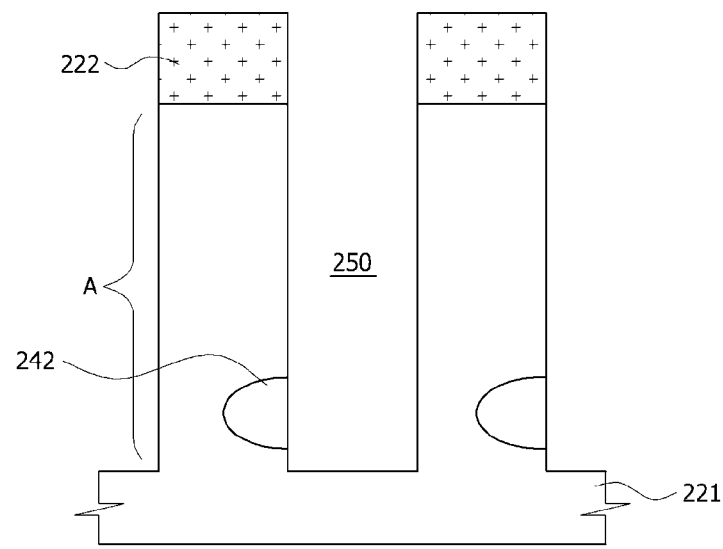
Figure 8:
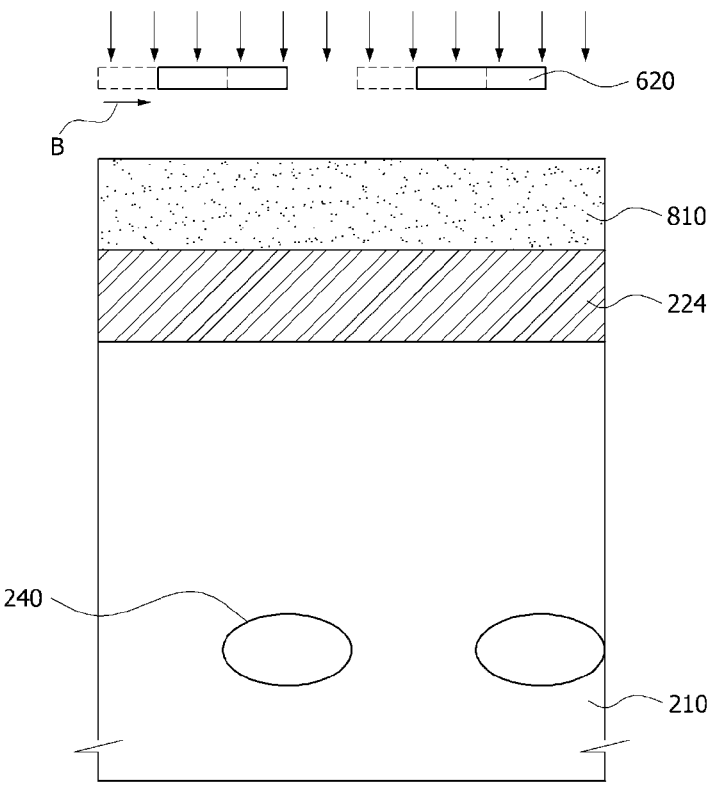

As illustrated in FIG. 8, in order to form a second mask pattern 222, a second mask layer 224 and a second photoresist layer 810 are sequentially formed on the semiconductor substrate 210 in which the impurity ion junction region 240 is formed. Next, an exposure process is performed on the second photoresist layer 810. Here, the photomask 620 having been used to form the first mask pattern 221 may be used to form the second mask pattern 222. By using the second mask pattern 222 as a hard mask for etching, a trench for removing a portion of, e.g., about a half of the impurity ion junction region 240 may be formed. According to the exemplary embodiment of the present invention, an exposure process is performed while positioning the photomask 620, which serves as a mask of the ion implantation for forming the impurity ion junction region 240, at a position which is shifted a certain distance, e.g., approximately 50% of the length of the impurity ion junction region 240 in a right direction from the prior position where the photomask 620 has been positioned during the forming of the first mask pattern 221, as indicated by an arrow B. For reference, the position of the photomask 620 during the exposure process on the first photoresist layer 610 is indicated by dotted lines. Then, a development process is performed to form a second photoresist pattern (222 in FIG. 4), and a process of forming a trench as described with reference to FIGS. 4 and 5 is performed. In this manner, the impurity ion junction region 240 and the trench 250 may be formed using the same photomask 620.

Referring to FIG. 5, the exposed region of the semiconductor substrate 210 is etched by a certain depth by an etching process using the second mask pattern 222 as a hard mask for etching. The etched depth of the semiconductor substrate 210 is deeper than that of the position at which the impurity ion junction region 240 is formed. A trench 250 is formed by this etching process, and the trench 250 defines an active region A in which a vertical transistor is to be formed and isolates the defined active region A from an adjacent active region 260. Consequently, the active region A is formed in a pillar shape protruding upwards. Due to the formation of the trench 250, a portion of the impurity ion junction region (240 in FIG. 4) is removed. On the other hand, a remaining portion of the impurity ion junction region (240 in FIG. 4) defines a buried bit line junction region 242 and is exposed at a lower side wall of the trench 250. The buried bit line junction region 242 becomes a drain region in a typical transistor structure.

Figure 9:
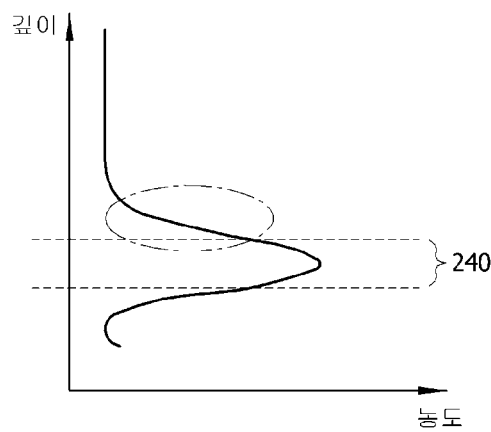
FIG. 9 is a graph showing a concentration profile of an impurity ion junction region formed by the method described with reference to FIGS. 2 to 5.

FIG. 9 is a graph showing a concentration profile of the impurity ion junction region 240 formed by the method described with reference to FIGS. 2 to 5. As illustrated in FIG. 9, the doping concentration of the region in which the impurity ion junction region 240 is formed is high, and the doping concentration of the remaining region is low. The region just over the impurity ion junction region 240 is a channel region. As illustrated by a dotted circle C, a threshold voltage may vary if the concentration of arsenide (As) in the channel region next to the impurity ion junction region 240 is high. Therefore, impurity ions having an opposite conductivity type may be additionally injected into the channel region.

Figure 10:
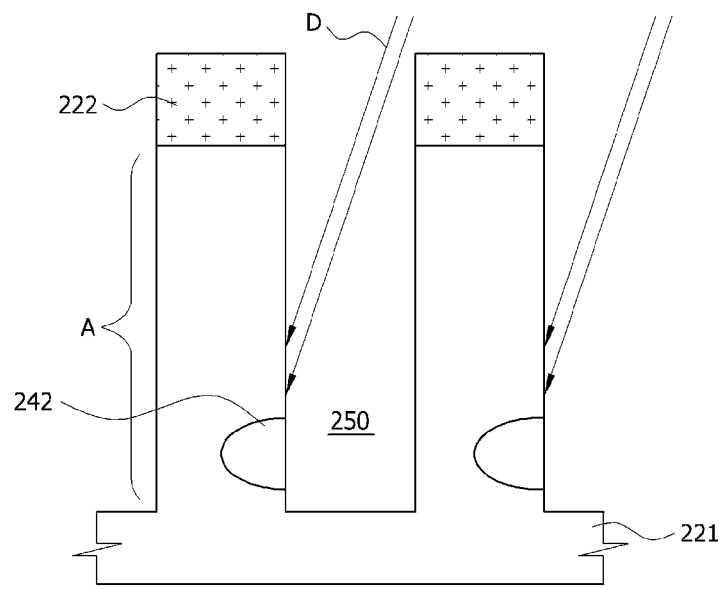
FIG. 10 is a cross-sectional view illustrating a process of additionally injecting ions in the method for forming the impurity region according to the exemplary embodiment of the present invention.

FIG. 10 is a cross-sectional view explaining the additional ion injection. Referring to FIG. 10, after forming the trench 250, an additional ion injection is performed on a portion of the channel region over the buried bit line junction region 242, as indicated by arrows D. In this case, the impurity ions having a conductivity type opposite to the impurity ions constituting the buried bit line junction region 242 are used. Since arsenide (As) which is n-type impurity ions is used as the impurity ions constituting the buried bit line junction region 242 in this exemplary embodiment, p-type impurity ions, e.g., boron (B), may be used in the additional ion injection. Since the additional ion injection should be performed on the selective region, a screen unit for blocking an ion injection into other regions may be used, and the additional ion injection may be performed using a tilt ion implantation process which implants ions at a certain angle in a vertical direction.

Figure 11:
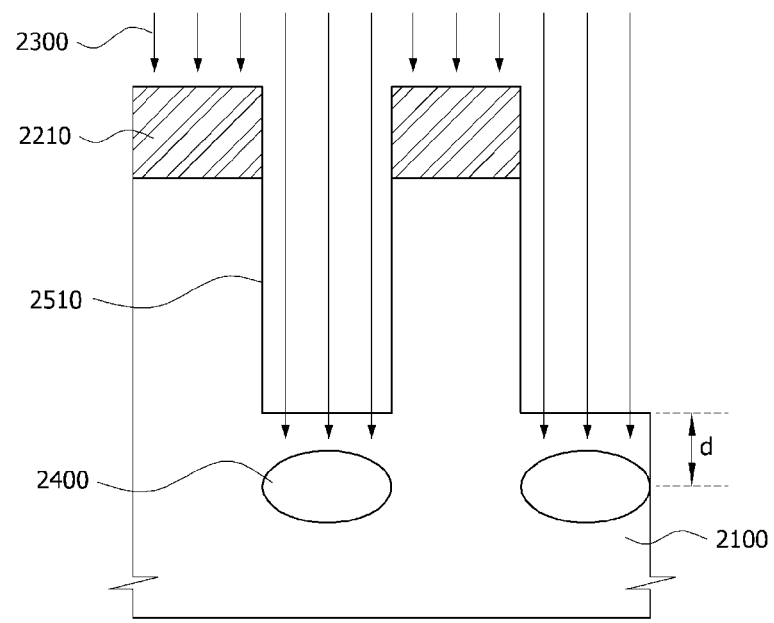
FIGS. 11 to 13 are cross-sectional views illustrating a method for forming an impurity region of a vertical transistor according to another exemplary embodiment of the present invention.
Figure 12:
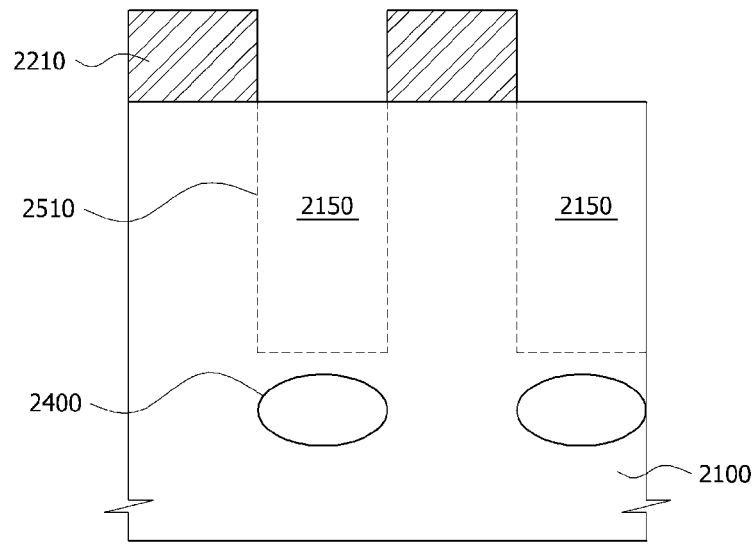
Figure 13:
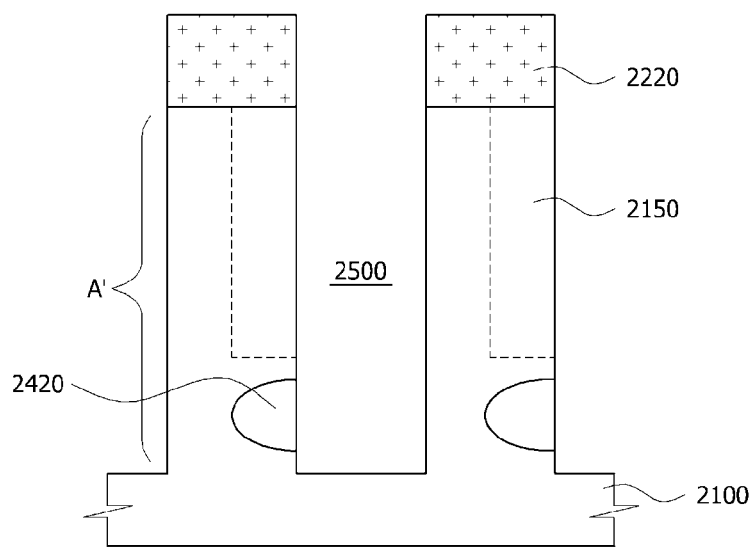

FIGS. 11 to 13 are cross-sectional views illustrating a method for forming an impurity region of a vertical transistor according to another exemplary embodiment of the present invention. Referring to FIG. 11, a first mask pattern 2210 is formed on a semiconductor substrate 2100 in the same method as that of forming the first mask pattern (221 in FIG. 2) described above with reference to FIG. 2. A first trench 2510 is formed by etching an exposed region of the semiconductor substrate 2100 by a certain depth using the first mask pattern 2210 as an etching mask. The depth of the first trench 2510 is set to be less than the depth of a position at which an impurity ion impurity junction region 2400 to be formed is located. As indicated by arrows 2300, an impurity ion junction region 2400 is formed by implanting impurity ions, e.g., arsenide (As). In this exemplary embodiment, when the ion implantation process is performed, the distance, from the surface of the semiconductor substrate 2100 to the position at which the impurity ion junction region 2400 to be formed is located, is smaller than that of the exemplary embodiment described above with reference to FIGS. 2 to 5. Accordingly, the ion implantation concentration may be controlled more precisely, and the ion implantation energy may also be controlled precisely. Thus, the impurity ion junction region 2400 may be formed at an intended exact position with a more exact doping concentration. In addition, as described above with reference to FIG. 9, since the doping concentration may be controlled such that a variation of a concentration of a channel region next to the impurity ion junction region 2400 is small, an intended threshold voltage characteristic of a device may be obtained without an additional ion implantation of an opposite conductivity type.

Referring to FIG. 12, the first trench 2510 is filled with a silicon layer. To this end, the silicon layer may be formed using a deposition process. However, in this exemplary embodiment, the silicon layer is formed by growing a silicon epitaxial layer 2150. The silicon epitaxial layer 2150 serves as a channel region in a vertical transistor. Therefore, if the silicon layer is formed by growing the silicon epitaxial layer 2150, a dopant concentration in the channel region can be controlled precisely by supplying an appropriate dopant gas together during the growth process. As a result, an uniform threshold voltage characteristic of a device may be obtained.

Figure 1:
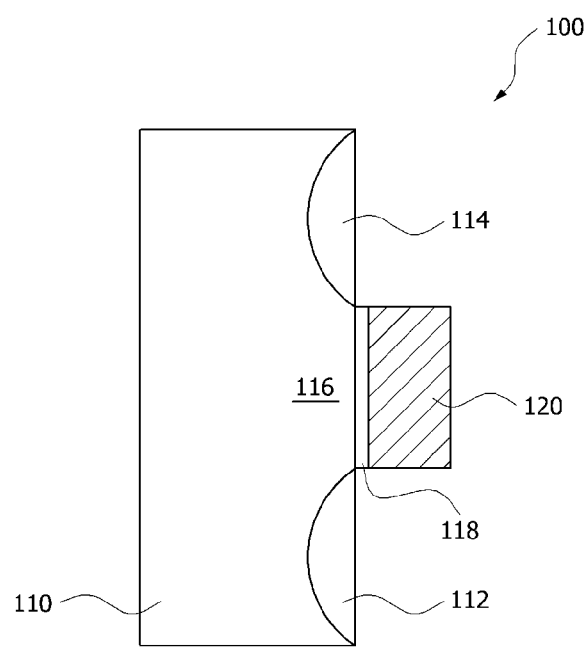
FIG. 1 is a diagram explaining the basic concept of a vertical transistor.

Referring to FIG. 13, a second mask pattern 2220 is formed on the semiconductor substrate 2100 and the silicon epitaxial layer 2150 by the same method as that described above with reference to FIG. 8. As described above with reference to FIG. 8, the second mask pattern 2220 is formed by shifting the photomask, which has been used during the process of forming the first mask pattern 2210, by approximately 50% in a horizontal direction. Thus, a portion of the silicon epitaxial layer 2150 is exposed by the second mask pattern 2220. Then, a portion of the silicon epitaxial layer 2150 and the semiconductor substrate 2100 are etched by a certain depth by using the second mask pattern 2220 as a hard mask. The depth of the semiconductor substrate 2100 etched by this etching process is deeper than that of the position at which the impurity ion junction region 2400 is formed. A second trench 2500 is formed by this etching process, and the second trench 2500 defines an active region A'. The active region A' is composed of the semiconductor substrate 2100 and the silicon epitaxial layer 2150. In addition, due to the formation of the second trench 2500, a portion of, e.g., about a half of the impurity ion junction region (2400 in FIG. 1) is removed. On the other hand, the remaining portion of the impurity ion junction region (2400 in FIG. 12) defines a buried bit line junction region 2420 and is exposed at a lower side wall of the trench 2500. The buried bit line junction region 2420 becomes a drain region in a transistor structure.

Figure 14:
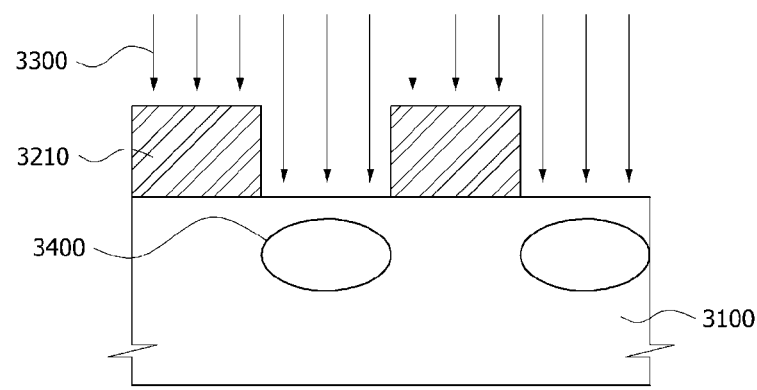
FIGS. 14 to 16 are cross-sectional views illustrating a method for forming an impurity region of a vertical transistor according to yet another exemplary embodiment of the present invention.
Figure 15:
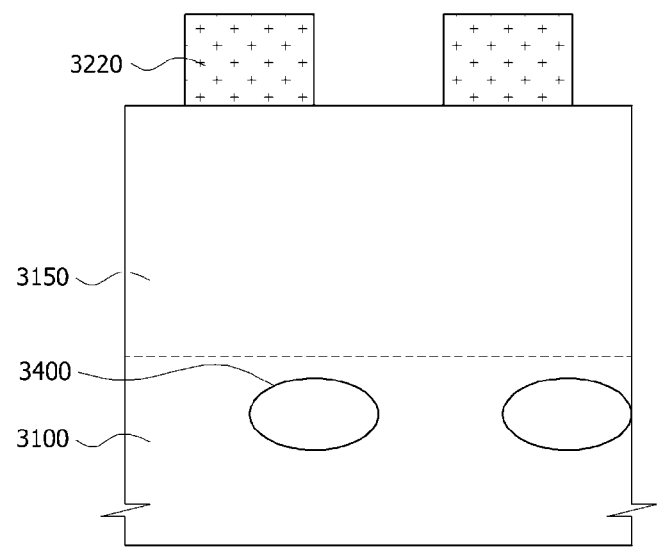
Figure 16:
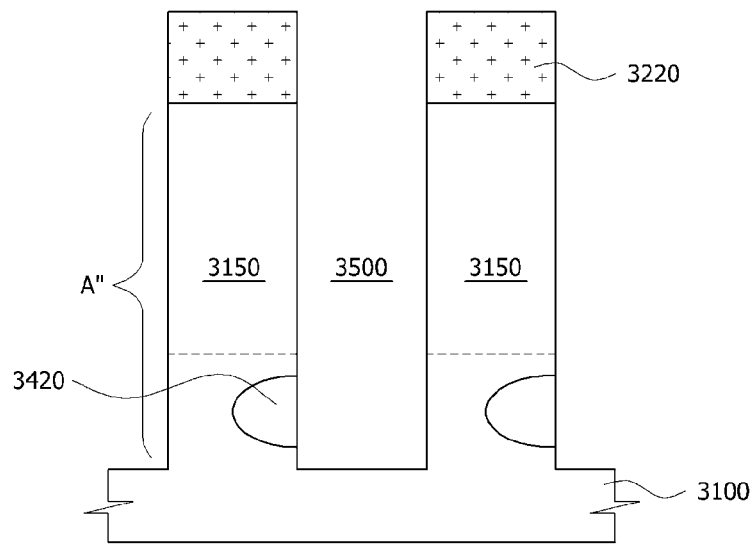

FIGS. 14 to 16 are cross-sectional views illustrating a method for forming an impurity region of a vertical transistor according to yet another exemplary embodiment of the present invention. Referring to FIG. 14, a first mask pattern 3210 is formed on a semiconductor substrate 3100 by the same method as that of forming the first mask pattern (221 in FIG. 2) described above with reference to FIG. 2. As indicated by arrows 3300, an impurity ion junction region 3400 is formed on the surface of the semiconductor substrate 3100 by implanting impurity ions, e.g., arsenide (As), using the first mask pattern 3210 as a mask for an ion implantation. In this exemplary embodiment, since the ion implantation is performed while targeting the surface of the semiconductor substrate 3100, the ion implantation concentration may be controlled more precisely, and the ion implantation energy may also be controlled precisely. Thus, the impurity ion junction region 3400 may be formed at an intended exact position with a more exact doping concentration. In addition, as described above with reference to FIG. 9, since the doping concentration may be controlled such that a variation of a concentration of a channel region next to the impurity ion junction region 3400 is small, an intended threshold voltage characteristic of a device may be obtained without an additional ion implantation of an opposite conductivity type.

Referring to FIG. 15, a material layer equal to the semiconductor substrate 3100, i.e., a silicon layer, is formed on the semiconductor substrate 3100 in which the impurity ion junction region 3400 is formed. The silicon layer may be formed using a deposition process. However, in this exemplary embodiment, the silicon layer is formed by growing a silicon epitaxial layer 3150. A portion of the silicon epitaxial layer 3150 becomes an active region and serves as a channel region in a vertical transistor. Therefore, if the silicon layer is formed by growing the silicon epitaxial layer 3150, a dopant concentration in the channel region may be controlled precisely by supplying an appropriate dopant gas together during the growth process. As a result, an uniform threshold voltage characteristic of a device may be obtained. A second mask pattern 3220 is formed on the silicon epitaxial layer 3150. As described above with reference to FIG. 8, the second mask pattern 3220 is formed by shifting the photomask, which has been used during the process of forming the first mask pattern 3210, by approximately 50% in a horizontal direction. Thus, a separate photomask for forming the second mask pattern 3220 is unnecessary. Thus, a portion of the silicon epitaxial layer 3150 at which a trench is to be formed is exposed by the second mask pattern 3220.

Referring to FIG. 16, the silicon epitaxial layer 3150 and the semiconductor substrate 3100 are etched by a certain depth by using the second mask pattern 3220 as a hard mask. The depth of the semiconductor substrate 3100 etched by this etching process is deeper than that of the position at which the impurity ion junction region 3400 is formed. A trench 3500 is formed by this etching process, and the trench 3500 defines an active region A". The active region A" is composed of the semiconductor substrate 3100 and the silicon epitaxial layer 3150. In addition, due to the formation of the second trench 3500, a portion of, e.g., about a half of the impurity ion junction region (3400 in FIG. 15) is removed. On the other hand, the remaining portion of the impurity ion junction region (3400 in FIG. 15) defines a buried bit line junction region 3420 and is exposed at a lower side wall of the trench 5500. The buried bit line junction region 3420 becomes a drain region in a transistor structure.

Figure 17:
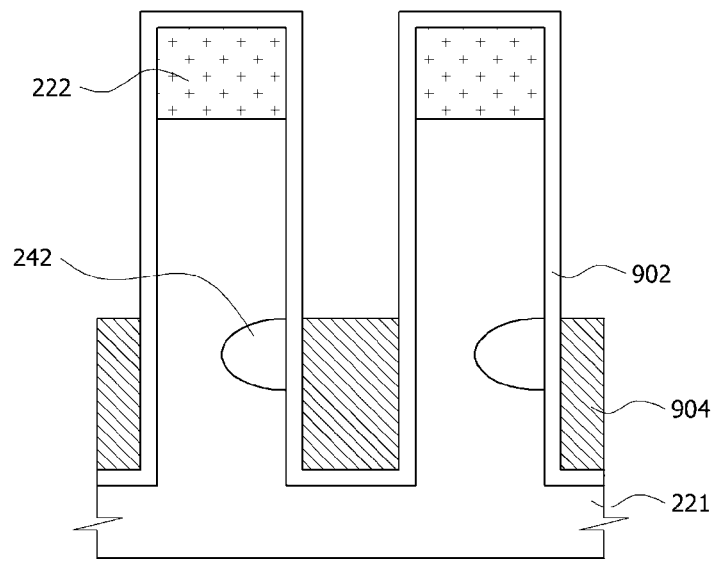
FIGS. 17 to 23 are cross-sectional views illustrating a method for fabricating a vertical transistor according to an exemplary embodiment of the present invention.

FIGS. 17 to 23 are cross-sectional views illustrating a method for fabricating a vertical transistor according to another exemplary embodiment of the present invention. Referring to FIG. 17, a buried bit line junction region 242 is formed in the same method as the methods of forming the buried bit line junction regions 242, 2420 and 3420 described above with reference to FIGS. 1 to 5, FIGS. 11 to 13, or FIGS. 14 to 16. Since the subsequent processes are substantially identical to the exemplary embodiment described with reference to FIGS. 1 to 5, the exemplary embodiment described with reference to FIGS. 11 to 13 and the exemplary embodiment described with reference to FIGS. 14 to 16, only the exemplary embodiment described with reference to FIGS. 1 to 5 will be described below. After forming the bit line junction region 242, a first liner layer 902 is formed on a resulting structure. The first liner layer 902 may be formed of oxide. The first liner layer 902 serves to electrically isolate the semiconductor substrate 221 from a buried bit line which will be subsequently formed. A first sacrificial layer 904 is formed on a resulting structure. The first sacrificial layer 904 is recessed so that the top surface of the first sacrificial layer 904 is aligned with the upper portion of the buried bit line junction region 242. The first sacrificial layer 904 may be formed of polysilicon. The process of forming the first sacrificial layer 904 may be performed trough an etchback process.

Figure 18:
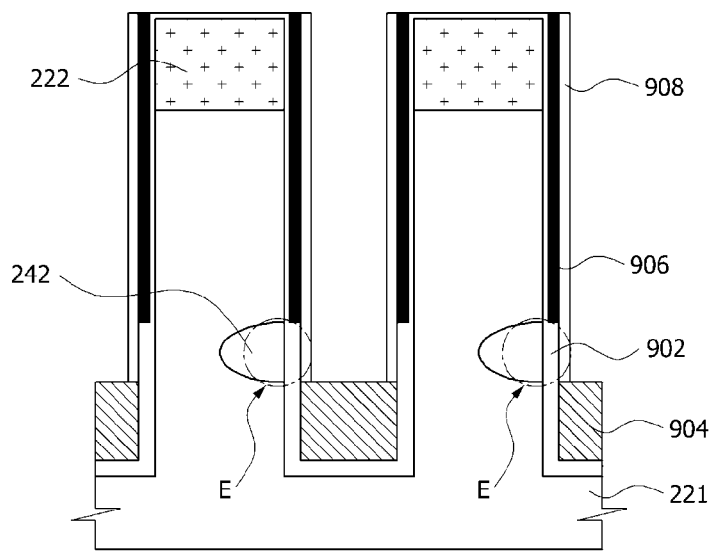

Referring to FIG. 18, a second liner layer 906 is formed on a resulting structure. The first liner layer 906 is formed of a material having a sufficient etching selectivity to the first liner layer 902. As an example, if the first liner layer 902 is formed of oxide, the second liner layer 906 is formed of nitride. The thickness of the second liner layer 906 is determined considering the thickness of the first sacrificial layer 904 which is to be recessed during a subsequent anisotropic etching of the second liner layer 906. More specifically, after forming the second liner layer 906, the anisotropic etching process is performed on the second liner layer 906 to form the second liner layer 906 in a spacer shape. Here, the first sacrificial layer 904 is also recessed and its thickness decreases. The first sacrificial layer 904 is recessed so that the recessed top surface of the first sacrificial layer 904 is aligned with the bottom surface of the opening of the buried bit line junction region 242. Therefore, the thickness of the second liner layer 906 is determined considering the recessed thickness of the first sacrificial layer 906. According to this exemplary embodiment, as the second liner layer 906 is recessed in a spacer shape, a region to be opened in the buried bit line junction region 242 is not overlapped with the second liner layer 906 and the first sacrificial layer 904, but is overlapped with only the first liner layer 902, as indicated by reference symbol "E". A third liner layer 908 is deposited on a resulting structure. An anisotropic etching process is performed on the third liner layer 908, so that the third liner layer 908 is formed in a spacer shape. The third liner layer 908 is formed of a material having a sufficient etching selectivity to the second liner layer 906 and the first sacrificial layer 904. As an example, if the second liner layer 906 is formed of nitride and the first sacrificial layer 904 is formed of polysilicon, the third liner layer 908 may be formed of titanium nitride (TiN).

Figure 19:
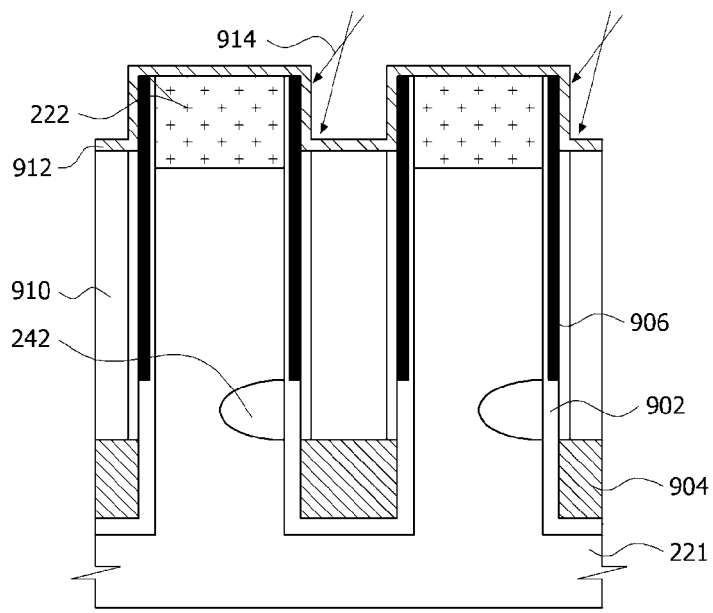

Referring to FIG. 19, a second sacrificial layer 910 is formed on a resulting structure, so that the trench is filled. The second sacrificial layer 910 is recessed by a certain depth. Before the recessing process, the second sacrificial layer 910 may be planarized. The second sacrificial layer 910 is formed of a material which can be etched by the same etching solution as that used to etch the first liner layer 902. As an example, if the first liner layer 902 is formed of oxide, the second sacrificial layer 910 may be formed by coating an oxide layer using a spin on dielectric (SOD) coating process. A fourth liner layer 912 is formed on a resulting structure. The fourth liner layer 912 is formed of a material which can be selectively removed. As an example, if the material is selectively removed by a selective ion implantation as in the exemplary embodiment of the present invention, the fourth liner layer 912 may be formed of polysilicon doped with impurity ions, e.g., boron (B). As indicated by arrows 914, an ion implantation is selectively performed on a portion of the fourth liner layer 912 which is intended to be removed. An ion implantation is selectively performed on a side of the active region at which the buried bit line junction region 242 is formed. To this end, a tilt ion implantation process is performed at a certain angle with respect to a vertical direction.

Figure 20:
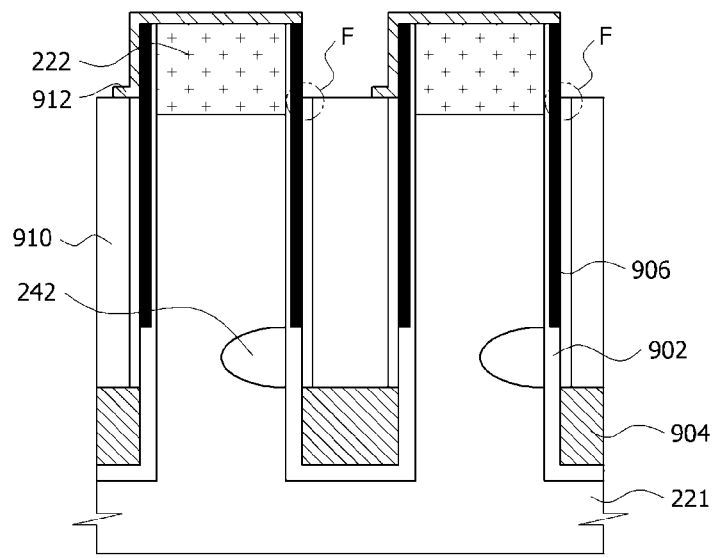

Referring to FIG. 20, the fourth liner layer 912 is etched to selectively remove the ion-implanted region thereof. The fourth liner layer 912 is divided into an ion-implanted region and a non-ion-implanted region. Due to the selective ion implantation, the two regions have different characteristics. By performing the etching process using such a characteristic difference, the ion-implanted region of the fourth liner layer 912 may be selectively removed. As indicated by reference symbol "F", the selective removal of the fourth liner layer 912 exposes the upper portion of the third liner layer 908 formed at a side of the active region at which the buried bit line junction region 242 is formed.

Figure 21:
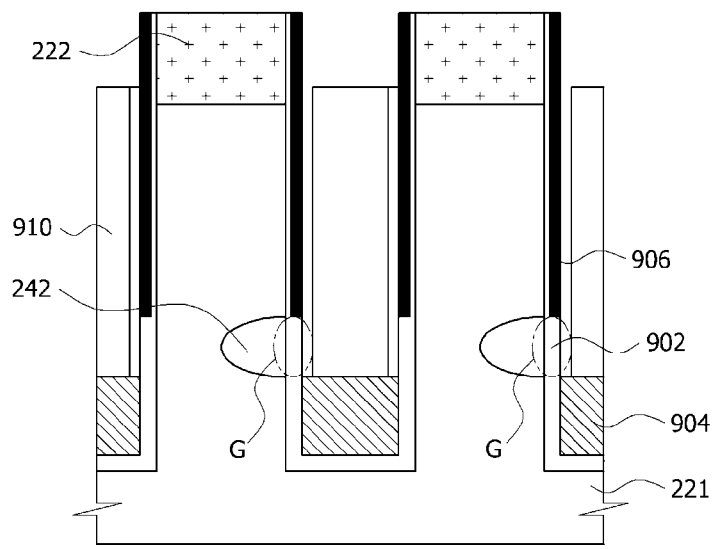

Referring to FIG. 21, an etching process is performed to remove the exposed third liner layer 908. This etching process may be performed by a dip-out process which dips the semiconductor substrate 210 into a container containing an etching solution which reacts with the third liner layer 908. The removal of the third liner layer 908 exposes the first liner layer 902 formed on the buried bit line junction region 242. After the third liner layer 908 is removed, the remaining portion of the fourth liner layer (912 in FIG. 17) is removed.

Figure 22:
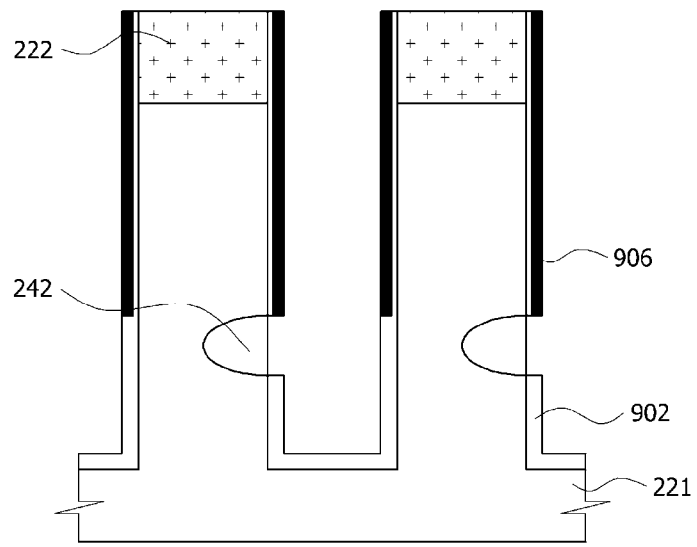

Referring to FIG. 22, an etching process is performed to remove the exposed regions of the second sacrificial layer 910 and the first liner layer 902. This etching process may be performed by a dip-out process. Since the second sacrificial layer 910 and the first liner layer 902 are formed of the same material, they are removed together with the same etching solution. Due to the etching process, the surface of the buried bit line junction region 242 is exposed together with the surface of the first sacrificial layer 904. Then, the first sacrificial layer 904 is removed.

Figure 23:
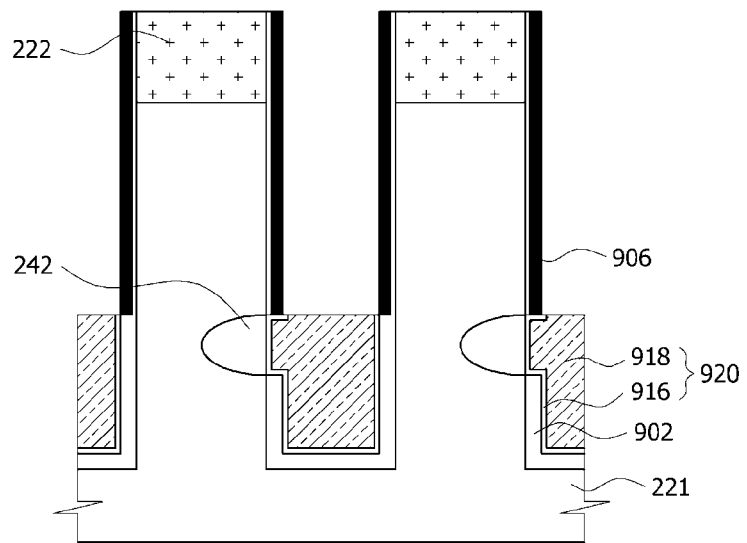

Referring to FIG. 23, a metal barrier layer 916 and a metal layer 918 are formed on a resulting structure. An anisotropic etching process such as an etchback process is performed to form a buried bit line 920 which is in contact with the buried bit line junction region 242. Although not illustrated, a metal silicide layer for ohmic contact is formed at a contact region between the buried bit line junction region 242 and the buried bit line 920. An insulation layer (not shown) is formed on the buried bit line 920. A gate dielectric layer (not shown) and a gate conductive layer (not shown) are formed on the insulation layer in such a state that the first liner layer 902 and the third liner layer 906 are removed. The second mask pattern 222 is removed, and an ion implantation process is performed to form another junction region on the active region.

According to the exemplary embodiments of the present invention, before the active region producing upwards is defined by the trench, the buried bit line junction region is formed in advance through the ion implantation process. Then, the etching process for forming the trench is performed. Thus, the overlapping region between the buried bit line junction region and the gate may be controlled precisely, as compared to the case of forming the buried bit line junction region after the trench is formed.

Although the embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A method for forming an impurity region of a vertical transistor, comprising:
  preparing a semiconductor substrate having a first region where an active region is to be formed, and a second region where a trench is to be formed;
  forming an impurity ion junction region in the first region and the second region; and
  etching a portion of the semiconductor substrate including the second region to form a trench exposing a side of the first region and to form an active region which protrudes upwards having the first region at a lower portion of the active region, wherein the etching process is performed to remove the impurity ion junction region of the second region, so that the impurity ion junction region remaining in the first region serves as a buried bit line junction region exposed within the trench, wherein the forming of the impurity ion junction region comprises:
forming a first mask pattern on the semiconductor substrate;
forming an impurity ion junction region under the semiconductor substrate by performing an ion implantation process using the first mask pattern as a mask for an ion implantation; and
removing the first mask pattern, wherein the forming of the trench comprises:
forming a second mask pattern on the semiconductor substrate,
wherein the second mask pattern covers a portion of the semiconductor substrate on the first region and exposes another portion of the semiconductor substrate on the second region; and
forming the trench by etching the another portion of the semiconductor substrate including the second region using the second mask pattern as an etching mask,
wherein the second mask pattern is formed by an exposure process performed in such a state that a photomask used to form the first mask pattern is shifted in a horizontal direction.

2. The method of claim 1, wherein the first mask pattern has an opening exposing a portion of the semiconductor substrate covering the first region and the second region.

3. The method of claim 1, wherein the first mask pattern comprises a nitride layer.

4. The method of claim 1, wherein the first mask pattern has a structure in which an oxide layer and a nitride layer are stacked.

5. The method of claim 1, wherein the ion implantation process is performed with an implantation energy of approximately 100 KeV to approximately 400 KeV so that the impurity ion junction region is formed at a depth of 500 Å to 2,000 Å below the surface of the semiconductor substrate.

6. The method of claim 1, wherein the second mask pattern comprises a nitride layer.

7. The method of claim 1, further comprising, after forming the trench, performing a process of implanting impurity ions into the buried bit line junction region, wherein a conductivity type of the impurity ions is opposite to the conductivity type of the buried bit line junction region.

8. A method for fabricating a vertical transistor, comprising:
forming an impurity ion junction region at a lower portion of the semiconductor substrate by performing an ion implantation process on the semiconductor substrate;
forming a trench by etching the semiconductor substrate, wherein the etching process is performed to remove a portion of the impurity ion junction region, so that a remaining portion of the impurity ion junction region is exposed at a lower portion of the trench and serves as a buried bit line junction region; and
forming a buried bit line by forming an insulation layer at a lower portion of the trench so that the buried bit line is in contact with the buried bit line junction region, wherein the forming of the impurity ion junction region comprises:
preparing a semiconductor substrate having a first region in which an active region is to be formed, and a second region in which a trench is to be formed;
forming a first mask pattern on the semiconductor substrate;
forming an impurity ion junction region at a lower portion of the semiconductor substrate by performing an ion implantation process using the first mask pattern as a mask for an ion implantation; and
removing the first mask pattern, wherein the forming of the trench comprises:
forming a second mask pattern on the semiconductor substrate, wherein the second mask pattern has an opening exposing a portion of the semiconductor substrate covering the second region of the semiconductor substrate; and
forming the trench by etching the portion of the semiconductor substrate covering the second region and the second region using the second mask pattern as an etching mask,
wherein the second mask pattern is formed by an exposure process in such a state that a photomask used to form the first mask pattern is shifted in a horizontal direction.

* * * * *